(12) United States Patent
Yang

(10) Patent No.: US 7,611,961 B2
(45) Date of Patent: Nov. 3, 2009

(54) METHOD FOR FABRICATING SEMICONDUCTOR WAFER WITH ENHANCED ALIGNMENT PERFORMANCE

(75) Inventor: Chin-Cheng Yang, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 278 days.

(21) Appl. No.: 11/613,896

(22) Filed: Dec. 20, 2006

(65) Prior Publication Data

US 2008/0153249 A1    Jun. 26, 2008

(51) Int. Cl.
*H01L 23/544*    (2006.01)

(52) U.S. Cl. ............... 438/401; 438/975; 257/E23.179

(58) Field of Classification Search ................. 438/401

See application file for complete search history.

(56) References Cited

U.S. PATENT DOCUMENTS

| 6,043,133 | A | 3/2000 | Jang et al. |
| 6,194,287 | B1* | 2/2001 | Jang ........................... 438/427 |
| 6,440,816 | B1 | 8/2002 | Farrow et al. |
| 6,939,777 | B2* | 9/2005 | Ohto et al. .................. 438/401 |
| 6,979,526 | B2 | 12/2005 | Ning |
| 2006/0223200 | A1* | 10/2006 | Maruyama ..................... 438/7 |

* cited by examiner

*Primary Examiner*—Stephen W Smoot
(74) *Attorney, Agent, or Firm*—J.C. Patents

(57) ABSTRACT

A manufacturing method of a semiconductor wafer includes forming a plurality of alignment trenches in the wafer substrate. A dielectric layer is formed over the substrate filling the trenches. A planarization process is performed to remove the dielectric layer above the substrate. A photolithograph process is subsequently performed to selectively remove the dielectric layer formed in the trenches in the alignment area.

15 Claims, 3 Drawing Sheets

METHOD FOR FABRICATING SEMICONDUCTOR WAFER WITH ENHANCED ALIGNMENT PERFORMANCE

BACKGROUND OF THE INVENTION

1. Field of Invention

The present invention relates to a method for fabricating a semiconductor wafer. More particularly, the present invention relates to a method for fabricating alignments marks on a semiconductor wafer, wherein alignment performance is enhanced.

2. Description of Related Art

The fabrication of semiconductor devices on a semiconductor wafer involves a transfer of a succession of patterns from photo masks onto the wafer. In order for the devices to perform properly, each circuit pattern must be formed aligning as precisely as possible with the circuit pattern that has been previously formed on the wafer. In other words, the overlay error must be minimized.

One alignment technique is known as the through-the-lens (TTL) alignment. The TTL alignment is characterized in that the alignment of a reticle or a mask and the wafer is effected through a projection optical system. The TTL alignment is achieved by illuminating the alignment marks on a reticle using a light source (for example, a 633 nm laser light), wherein each reticle alignment mark is composed of a series of parallel lines with a pitch. The image of the reticle alignment mark is projected by the projection optical system onto the wafer bearing alignment marks having similar alignment patterns of the reticle alignment mark. Portions of the light which are incident on the alignment pattern of the wafer alignment mark are reflected and detected. The portions of the light which are incident on the lines of the wafer alignment mark are strongly reflected, while the portions of the light that are incident between the lines are weakly reflected. Optimum alignment occurs when the alignment pattern on the reticle is properly aligned with the alignment pattern on the wafer. Typically, a minimum of two alignment marks is defined on each wafer, although increasing the number of alignment marks increases the alignment accuracy. However, the presence of these marks on the wafer reduces the available area for semiconductor elements. The increase of alignment marks for increasing the alignment accuracy is thereby hindered.

Alternatively, alignment marks, known as the ATHENA (Advanced Technology using High order Enhancement of Alignment) marks, are formed in the scribe line area provided between chips. In the ATHENA alignment technique, light is radiated onto the wafer. The radiated light is diffracted by the alignment marks, and the diffraction pattern is detected. The relative position of the wafer and the photomask is then adjusted accordingly. The quality of the diffracted light from the alignment mark is a directly related to the structure of the alignment mark, such as the material or the dimension of the mark. Since the alignment marks are formed in the scribe line area, there will be no unwanted loss of dies. Further, additional alignment marks may form per wafer, for example, two marks per shot or 8 to 18 marks per wafer, to improve the alignment accuracy.

Typically, each alignment mark comprises a topographical pattern, such a plurality of grooves and lands, which can be formed by, for example etching a controlled depth into wafer. The etching of the wafer creates a step height in the wafer. Once the alignment mark is formed on a wafer, it will be used for position detection in subsequent processes. However as the wafer has undergone various processes of forming circuit patterns thereon, the integrity of the alignment mark on the wafer is compromised. For example, some of the intermediate processing steps of forming circuit patterns on the wafer, such as chemical mechanical polishing (CMP) or deposition of thick or opaque layer, can damage or distort the alignment marks on the wafer or bury the marks under opaque layers.

When a chemical mechanical polishing (CMP) process, which is planarization technique, is performed to planarize a dielectric layer, not only the dielectric layer over the semiconductor element area is planarized, the dielectric layer over the alignment mark in the scribe line area is also planarized. Accordingly, the step height of the alignment mark is destroyed. If polysilicon or metal silicide or metal layers, which are opaque, are further formed thereon, the alignment mark will become invisible.

When the alignment mark has low reflectivity and small step height, the mark is difficult to be detected. Further, since additional layers may have deposited on the mark, the reading of the mark is interfered, for example the contrast of the image of the mark is poor and the reading of the image is noisy.

SUMMARY OF THE INVENTION

In view of the foregoing, the present invention provides a method for fabricating a semiconductor wafer, wherein alignment accuracy and overlay error are improved.

The present invention also provides a method for fabricating a semiconductor wafer, wherein the removal of the alignment mark subsequent to a planarization process can be prevented.

The present invention provides a method for fabricating an alignment mark, wherein the step height of the alignment mark is preserved and replicated in subsequently formed layers.

According to one aspect of fabrication method of a semiconductor wafer of the present invention, a substrate having at least an alignment area is provided. The alignment area further includes at least one alignment mark in a form of trenches formed in the substrate. A dielectric layer is deposited covering the substrate and filling the trenches. Thereafter, a portion of the dielectric layer above the substrate is removed. A photolithograph and etching process is performed to selectively remove the portion of the dielectric layer in the trenches. The removal of the portion of the dielectric layer includes performing a planarization process, for example.

According to the fabrication method of a semiconductor wafer of the present invention, a photomask is provided for the photolithograph and etching process, wherein the pattern on the photomask corresponds to the dimension and the position of the alignment mark.

According to the fabrication method of a semiconductor wafer of the present invention, photo exposure of the photolithograph and etching process is only performed at the alignment area.

According to another aspect of fabrication method of a semiconductor wafer of the present invention, a substrate having at least an alignment area and a device area is provided. A plurality of first trenches and a plurality of second trenches are formed in the substrate of the alignment area and the device area, respectively. A dielectric layer is formed over the substrate and filling the first and the second trenches. Thereafter, a planarization process is performed to remove the dielectric layer above the substrate. A photolithograph and etching process is subsequently performed to selectively remove the dielectric layer in the first trenches.

According to the fabrication method of a semiconductor wafer of the present invention, a photomask is provided for the photolithograph and etching process, wherein the pattern on the photomask corresponds to the dimension and position of the first trenches.

According to the fabrication method of a semiconductor wafer of the present invention, photo exposure of the photolithograph and etching process is performed selectively at the first trenches.

In accordance to the fabrication method of a semiconductor wafer of the present invention, since the dielectric layer formed in the alignment mark is removed, the step height of the alignment mark is preserved.

Further, since the pattern of the photomask, used in selectively removing the dielectric layer in the alignment mark, corresponds to the dimension and position of the alignment mark, the photomask is simple and thus inexpensive.

Moreover, only limited photo exposures are performed at selective locations, for example, only at the locations of the alignment mark, the throughput can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A to 1F are schematic, cross-sectional views showing selected process steps for fabricating a semiconductor wafer including an alignment area and a device area according to one embodiment of the present invention.

Figure 1A:
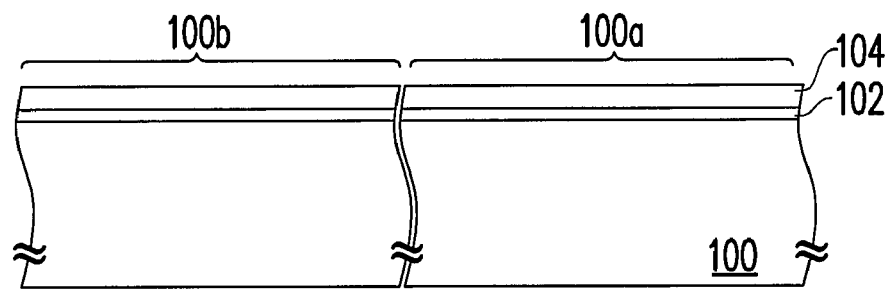
FIGS. 1A to 1F are schematic, cross-sectional views showing selected process steps for fabricating a semiconductor wafer including an alignment area and a device area according to one embodiment of the present invention.

Referring to FIG. 1A, a substrate 100 of a semiconductor wafer is provided, wherein the substrate 100 comprises at least a device area 100a and an alignment area 100b. The substrate 100 is a silicon substrate, for example. In one aspect of the invention, the alignment area 100b is configured in regions include but not limited to the scribe line area of the wafer.

An oxide layer 102 is then formed on the substrate 100. The oxide layer 102 is either grown by an oxidation method or deposited by a chemical vapor deposition method on the substrate 100 to a thickness of about 150 Å to 200 Å, for example. The oxide layer 102 is, for example, a pad oxide layer serves to protect the substrate 100 of the subsequent processes. A dielectric layer 104 is further formed over the oxide layer 102. The dielectric layer 104 that preferably contains nitride, may serve as an etch stop layer. The thickness of the dielectric layer 104 is about 1100 Å to 1500 Å, for example.

Figure 1B:
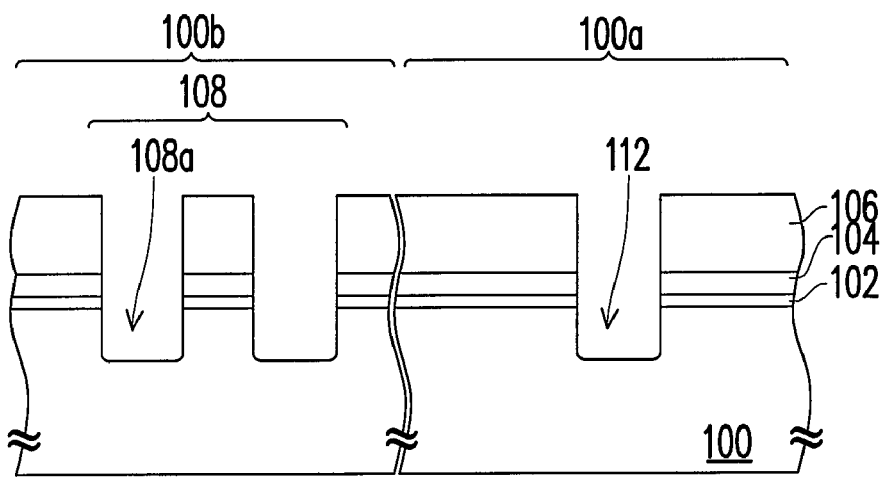

Referring to FIG. 1B, a patterned photoresist layer 106 is formed over the substrate 100, exposing a part of device area 100a where patterned feature definitions are going to be formed and a part of the alignment area 100b where alignment marks are going to be formed. Using the patterned photoresist layer 106 as an etching mask, the dielectric layer 104, the oxide layer 102 and the substrate 100 in the alignment area 100b are etched to form a plurality of alignment trenches 108a in the substrate 100. These alignment trenches 108a basically constitute an alignment mark 108 used in the subsequent processes for aligning photomasks with the wafer. In one aspect of the invention, the dielectric layer 104, the oxide layer 102 and the substrate 100 in the device area 100a are concurrently removed to form at least a patterned feature definition in the substrate 100. For example, an isolation trench 112 is formed in the substrate 100 for defining an active area in the device area 100a. The etching is, for example, an anisotropic etching such as a reactive ion etching. In one embodiment, the depth of the trenches 108a, 112 is about 2900 Å to 3200 Å.

Figure 1C:
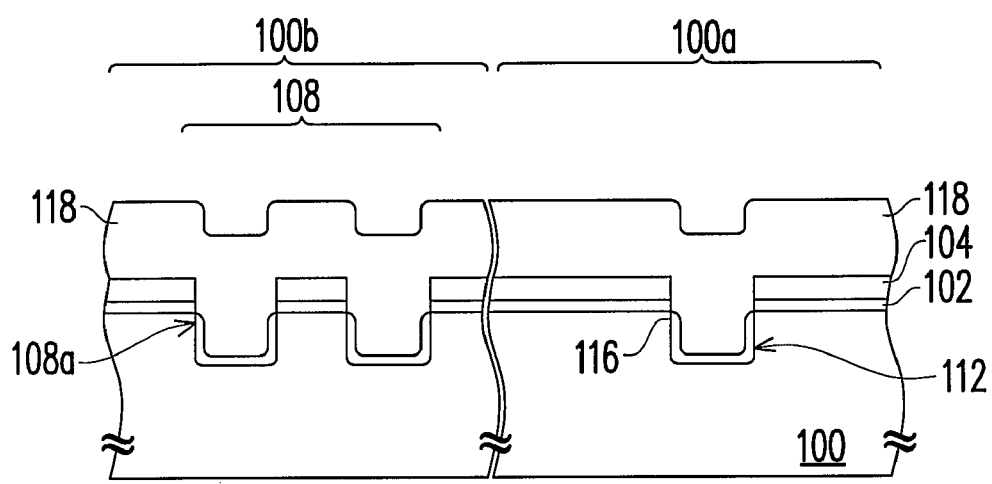

As shown in FIG. 1C, the patterned photoresist layer 106 is removed. Thereafter, one or more layers may deposit to line the trenches 108a, 112. In one aspect of the invention, the one or more liner layers 116 may include, for example an oxide layer, a nitride layer and/or a silicon oxynitride layer. A total thickness of the one or more liner layers 116 is about 150 Å to about 275 Å, for example. In the case that the one or more liner layers 116 include an oxide layer and a nitride layer, the oxide layer is formed by growing in a furnace at about 1000° C. to 1200° C. to about 170 Å to 220 Å thick, for example, while the nitride layer of about 50 Å to 70 Å thick is formed by treating the oxide layer in ambient $N_2$ at an elevated temperature or performing a nitrogen atom implant process, followed by an annealing process.

Still referring to FIG. 1C, a dielectric layer 118, typically a thick oxide layer, is blank deposited over the substrate 100 to a thickness of about 6000 Å to 7000 Å, filling the isolation trench 112 in the device area 100a and the alignment trenches 108a in the alignment area 100b. For example, the dielectric layer 118 may form by performing a high density plasma chemical vapor deposition (HDPCVD), followed by an annealing process at about 1000° C. to 1100° C. for densification purposes. As seen in FIG. 1C, although the alignment trenches 108a is covered by the dielectric layer 118, the alignment mark 108 (for example, the step height) is preserved in the dielectric layer 118.

Figure 1D:
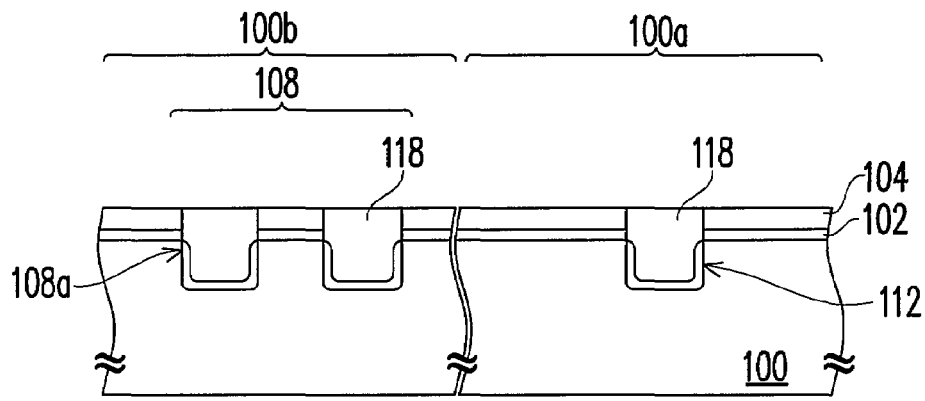

Continuing to FIG. 1D, a chemical mechanical planarization (CMP) process is performed. The CMP process is a global planarization process that planarizes the dielectric layer 118 in both the device area 100a and the alignment area 100b until the dielectric layer 104 is exposed. As can be seen, CMP removes the step height in the alignment mark 108.

Figure 1E:
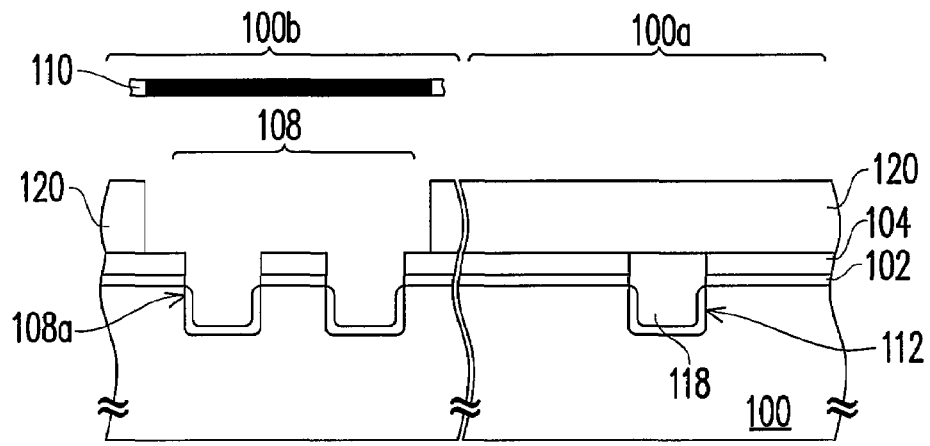
Figure 2:
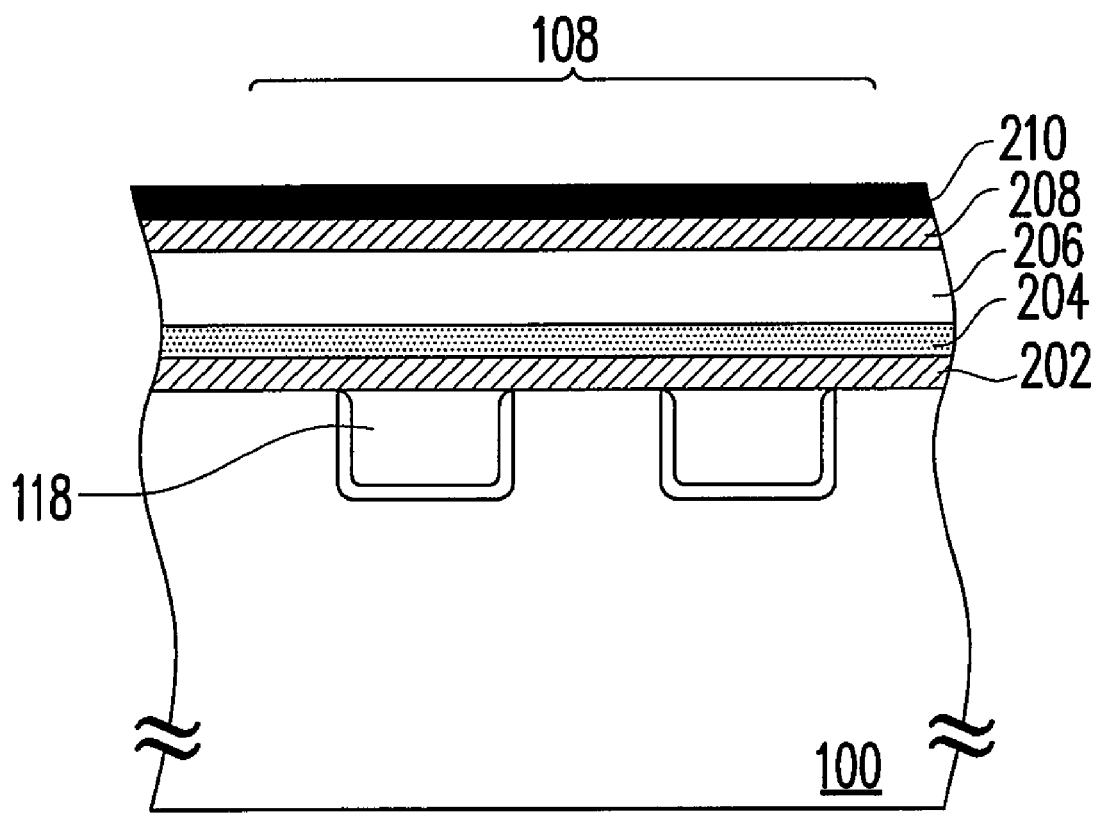
FIG. 2 is a schematic cross-sectional view of the alignment area with the deposition of material layers over the alignment area subsequent to the process step depicted in FIG. 1D.

In the case that the alignment mark 108 as shown in FIG. 1E is continued to use for fabricating subsequent layers of the integrated circuits, layers, such as a diffusion layer or a gate layer, etc., will be deposited thereon. Referring to FIG. 2, wherein FIG. 2 is a schematic cross-sectional view of the alignment area after the deposition of material layers over the alignment area subsequent to the process step depicted in FIG. 1D. After the CMP process, a polysilicon layer 202, a silicon nitride layer 204, for example, may form over the alignment mark 108. Although the step height has been removed, the alignment mark 108 may still be vaguely visible due to an image contrast between the silicon substrate 100 and the oxide dielectric layer 118 deposited in the alignment mark 108. However, with the subsequent depositions of an oxide layer 206, a polysilicon layer 208 and a metal silicide layer 210, for example, the alignment mark 108 becomes completely invisible because some of these layers are opaque and the step height has been removed during the planarization process.

Accordingly, the present invention provides a selective photolithograph process subsequent to the planarization process. The photomask used in the selective photolithograph process has a pattern that corresponds to the dimension and position of the alignment mark. As depicted in FIG. 1E, using the photomask 110, a patterned photoresist 120 is formed over the substrate 100 by performing photo exposures selectively to the alignment mark 108 area, for example just 8 to 16 exposure locations Basically, the patterned photoresist 120 is designed to expose only the alignment mark 108 area.

Using the patterned photoresist 120 as a mask, the dielectric layer 118 formed inside the alignment mark 108 is removed. The dielectric layer 118 is removed by methods including wet etching, with a buffered oxide etch solution comprising ammonium fluoride and hydrofluoric acid, for example. The removal of the dielectric layer 118 in the alignment trenches 108a again creates a step height in the alignment mark 108.

Figure 1F:
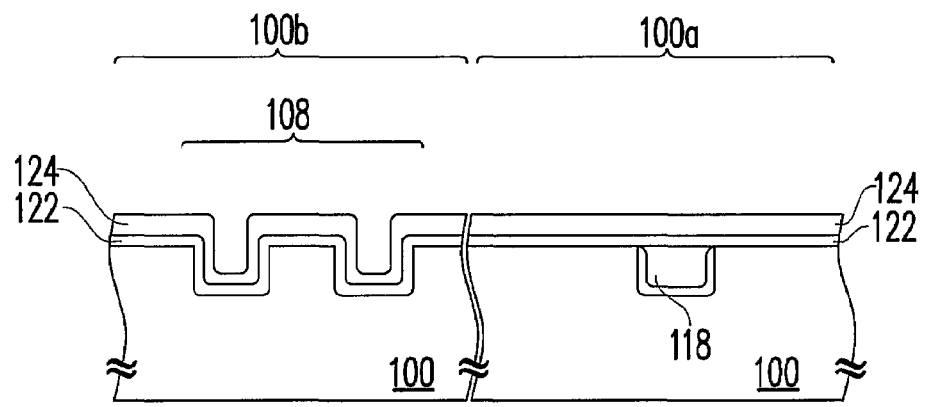

Referring to FIG. 1F, the photoresist layer 120 is stripped eventually. Thereafter, the dielectric layer 104 disposed over the substrate 100 is removed, for example, using hot phosphoric acid and the underlying oxide layer 102 is removed, for example, with a hydrofluoric acid solution.

Thereafter, by utilizing the alignment mark 108 formed in the abovementioned process steps, subsequent layers used to form the integrated circuits are formed over the wafer substrate 100. For example, in one embodiment, a conductive layer 122 and a dielectric layer 124 may sequentially form over the substrate 100 of both the device area 100a and the alignment area 100b. The conductive layer 122 may include a polysilicon layer, for example. The dielectric layer 124 includes but not limited to a nitride layer. Although the alignment mark 108 is covered by these material layers, the step height and therefore, the alignment mark 108, is replicated in these layers, for example, the conductive layer 122 and the dielectric layer 124. The replicated alignment mark 108 can be used for aligning subsequent layers, including metallic layers that are opaque. Since the step height of the alignment mark 108 is preserved, the alignment of the subsequent layers can be accomplished and the alignment performance is enhanced.

In accordance to the present invention, since the step height of the alignment mark 108 is preserved, the reading of the alignment mark is facilitated and the alignment of the subsequent layers, including opaque layers, can be achieved more precisely. Therefore, the alignment accuracy and stability can be improved, and the overlay error can be better controlled.

Further, the photomask used in the selective photolithograph process is for exposing the alignment mark 108 area. The pattern of the photomask may simply correspond to the dimension and the position of the alignment mark. Therefore, the design of the photomask is simple and inexpensive. Further, only limited photo exposures are performed at selective locations, for example, only at the locations of the alignment mark, the throughput can be improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating a semiconductor wafer having an alignment area, the method comprising:

forming a dielectric layer over a surface of a substrate;
forming a trench in the substrate of the alignment area;
forming a liner layer to line the trench;
forming a material layer covering the substrate and filling the trench;
removing a portion of the material layer above the substrate;
performing a photolithograph and etching process to remove a remaining portion of the material layer in the trench, wherein the photolithograph and etching process is only performed at the alignment area; and
removing the dielectric layer subsequent to the removal of the remaining portion of the material layer in the trench.

2. The method of claim 1, wherein the step of the photolithograph and etching process comprises:

forming a photomask having a pattern over the substrate; and
performing a photo exposure process at the alignment area using the photomask.

3. The method of claim 2, wherein the pattern of the photomask corresponds to a position and a dimension of the trench.

4. The method of claim 1, wherein the alignment area is configured in a scribe line region.

5. The method of claim 1, wherein the portion of the material layer above the substrate is removed by performing a planarization process.

6. A method for fabricating a semiconductor wafer, the method comprising:

providing a substrate having an alignment area and a device area;
forming a second dielectric layer on a surface of the substrate;
forming a plurality of first trenches as alignment marks in the alignment area and a plurality of second trenches in the device area, wherein each alignment mark comprises a step height;
forming a liner layer to line the first trenches and the second trenches;
forming a first dielectric layer over the substrate filling the first and the second trenches;
performing a planarization process to remove a portion of the first dielectric layer above the substrate;
performing a photolithograph and etching process to remove the first dielectric layer remaining in the first trenches, wherein the photolithograph and etching process is only performed at the alignment area; and
removing the second dielectric layer after the photolithograph and etching process.

7. The method of claim 6, wherein a photomask used in the photolithograph and etching process comprises a pattern that corresponds to positions and dimensions of the alignment marks.

8. The method of claim 6, wherein the step of the photolithograph and etching process comprises performing a photo exposure process on areas of the alignment marks.

9. The method of claim 6, wherein material layers are subsequently deposited over the alignment marks, and the step height of the alignment marks is replicated in the material layers.

10. The method of claim 6, wherein the first and the second trenches are about 2900 Å to 3200 Å deep.

11. The method of claim 6, wherein the alignment area is located in a scribe line area.

12. A method for fabricating a semiconductor wafer, the method comprising:

providing a substrate having an alignment area and a device area;
forming a first dielectric layer over the substrate surface;

forming a plurality of alignment marks in the alignment area and at least a first trench in the device area, wherein each alignment mark comprises at least a second trench;

forming a liner layer to line the first trenches and the second trenches;

forming a second dielectric layer over the substrate filling the first and the second trench;

performing a planarization process to remove a portion of the second dielectric layer above the substrate;

performing a photolithograph and etching process to remove the second dielectric layer in the second trench, wherein the photolithograph and etching process is only performed at the alignment area; and removing the first dielectric layer subsequent to the removal of the second dielectric layer in the second trench.

13. The method of claim 12, wherein the first trench and the second trench are about 2900 Å to 3200 Å deep.

14. The method of claim 12, wherein the second dielectric layer is an oxide layer formed by high density plasma chemical vapor deposition.

15. The method of claim 12, wherein the planarization process is a chemical mechanical polishing process.

* * * * *